United States Patent [19]
Simon et al.

[11] Patent Number: 5,900,930
[45] Date of Patent: May 4, 1999

[54] ANGLE SENSOR USING A MULTI-PIXEL OPTICAL DEVICE

[75] Inventors: Marc R. Simon, Whitefish Bay; CheeGreg Chen, River Hills; Zeyad M. Almajed, Greenfield; Roger J. Briggs, Colgate, all of Wis.

[73] Assignee: Eaton Corporation, Cleveland, Ohio

[21] Appl. No.: 08/955,830

[22] Filed: Oct. 21, 1997

[51] Int. Cl.$^6$ .............................. G01B 11/26; G01C 1/00
[52] U.S. Cl. ................... 356/138; 356/375; 250/231.13; 250/231.17
[58] Field of Search ............................. 356/138, 2, 139, 356/390, 375; 250/231.13, 231.14, 231.17, 231.18, 559.37, 559.39; 341/13

[56] References Cited

U.S. PATENT DOCUMENTS

| | | | |
|---|---|---|---|
| 4,103,155 | 7/1978 | Clark | 250/231.13 |
| 4,947,036 | 8/1990 | Pokorski et al. | 250/226.1 |
| 5,471,515 | 11/1995 | Fossum et al. | 377/60 |
| 5,625,210 | 4/1997 | Lee et al. | 257/292 |
| 5,646,523 | 7/1997 | Kaiser et al. | 324/207.2 |
| 5,665,974 | 9/1997 | Truong | 250/231.18 |

FOREIGN PATENT DOCUMENTS

| | | |
|---|---|---|
| 2743419 | 7/1997 | France . |
| 8193820 | 7/1996 | Japan . |
| 9628335 | 9/1996 | WIPO . |
| 9821070 | 5/1998 | WIPO . |

*Primary Examiner*—Robert Kim
*Attorney, Agent, or Firm*—Charles E. Kosinski

[57] ABSTRACT

An angle sensor for detecting the angular position of a rotating body. The angle sensor includes a plurality of digital patterns positioned on a surface that rotates with a rotating body. A source of light illuminates the patterns, and a multi-pixel optical device receives light from the patterns and converts the light into electrical signals. A processing circuit receives the electrical signals and identifies the illuminated patterns.

20 Claims, 5 Drawing Sheets

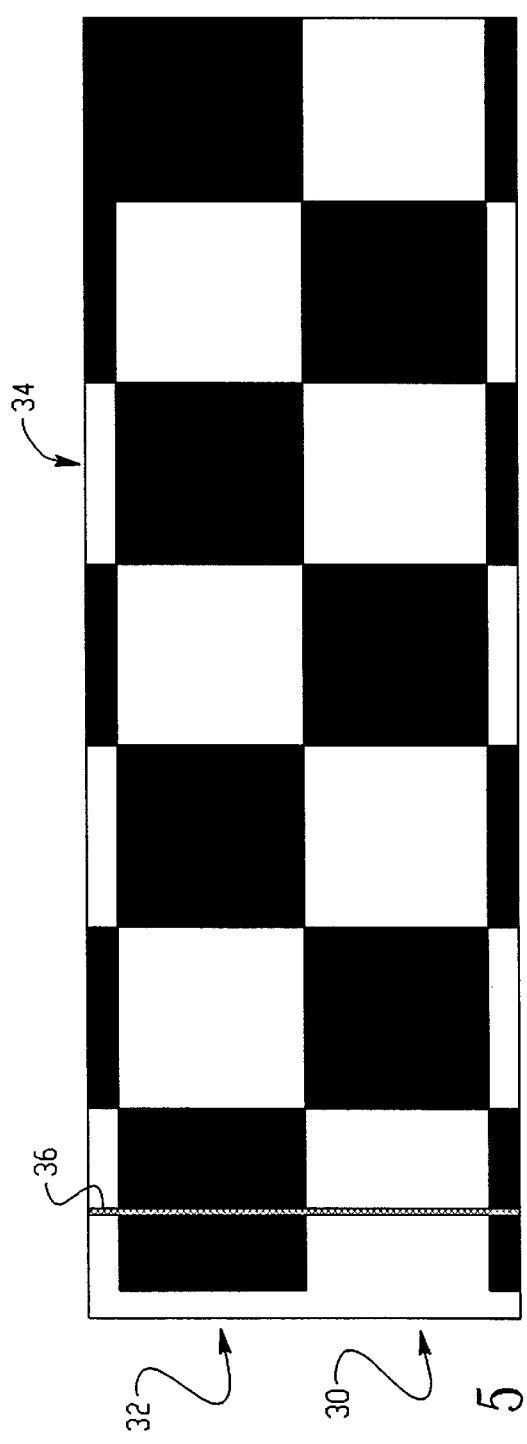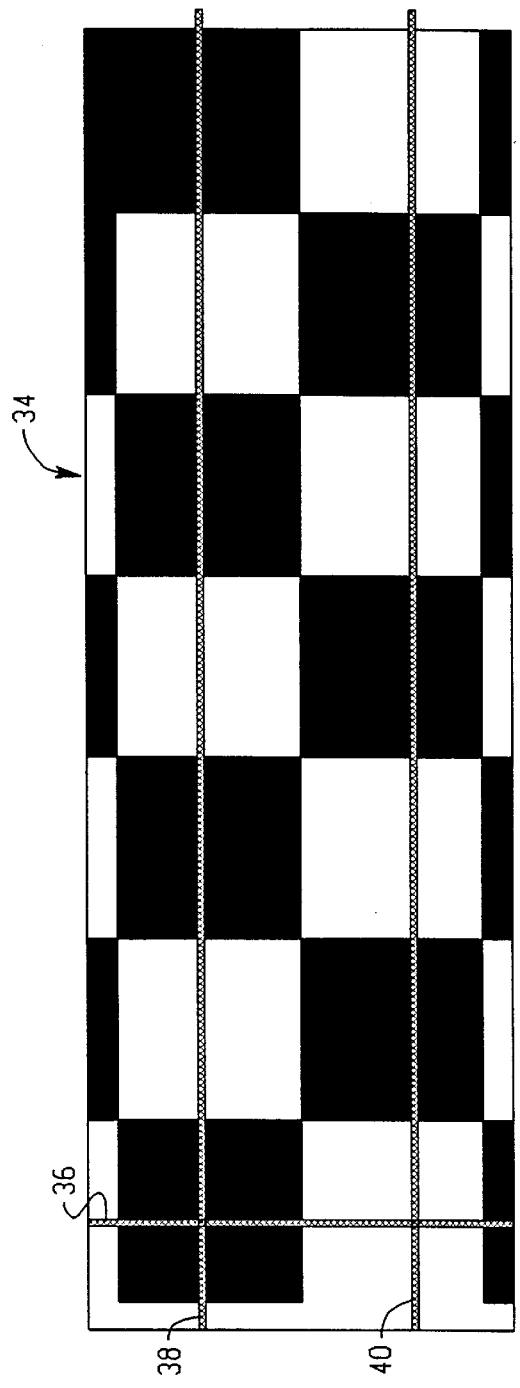
Fig. 5
Fig. 6

ANGLE SENSOR USING A MULTI-PIXEL OPTICAL DEVICE

FIELD OF INVENTION

The present invention relates to a angle sensor for determining the angular position of a rotating body, and particularly to an angle sensor that implements a multi-pixel optical device.

BACKGROUND OF THE INVENTION

In many situations, it is desirable to know the angular position and/or the angular rotation of a rotating body. For example, in the automotive vehicle, it is desirable to know the position of the steering wheel so that high-level performance features can be implemented such as variable assist power steering and adaptive suspension systems. As such, angle sensors to determine the angular position of a rotating body have been developed in the past. These prior art sensors typically rely on either mechanical (involving physical contact), magnetic, or optic sensors to sense the movement of the rotating body.

Although such prior art sensors have functioned relatively well in the past, they suffer from a multitude of problems. One such problem is that the prior art sensors have not been able to resolve differences in angular positions of less than 1 degree. This limitation in resolution renders the prior art devices incapable of meeting the needs of complex modern devices which now require resolutions approaching 0.1 degree.

Another problem is that the prior art angle sensors typically have multiple sensors and connections which require a complicated and precise set-up. As such, the prior art sensors are generally difficult and expensive to manufacture. Furthermore, the complicated nature of the sensors makes them difficult to maintain as well.

Thus, an improved angle sensor is needed that does not suffer from the above-mentioned problems.

SUMMARY OF THE INVENTION

The present invention provides an improved angle sensor which meets all of the above-identified needs.

The angle sensor of the present invention includes a plurality of digital patterns positioned on a surface that rotates with a rotating body. A source of light is provided for illuminating a section of the digital patterns at a fixed reference area. A multi-pixel optical device is positioned at the fixed reference area, the optical device receiving light from the section of the digital patterns and converting the light into a plurality of electrical signals. A processing circuit is connected to the multi-pixel optical device and receives the electrical signals, the processing circuit including logic and memory for analyzing the electrical signals and identifying the digital patterns at the fixed reference area.

BRIEF DESCRIPTION OF THE DRAWINGS

FIGS. 5 and 6 show a window that is viewed by the multi-pixel sensor used in the present invention.

DETAILED DESCRIPTION OF THE INVENTION

The angle sensor of the present invention can be implemented in any device or situation in which the sensing of the angular position of a rotating body is required or beneficial, including, but not limited to, vehicular steering wheel systems, robotics arm controls, rotational limit switches, crankshaft angle positioning, the alignment of platforms for optical or microwave systems, and positioning tracking antennas. The following description focuses on the present invention's application within a vehicular steering wheel system for the purposes of explanation only.

Figure 1:
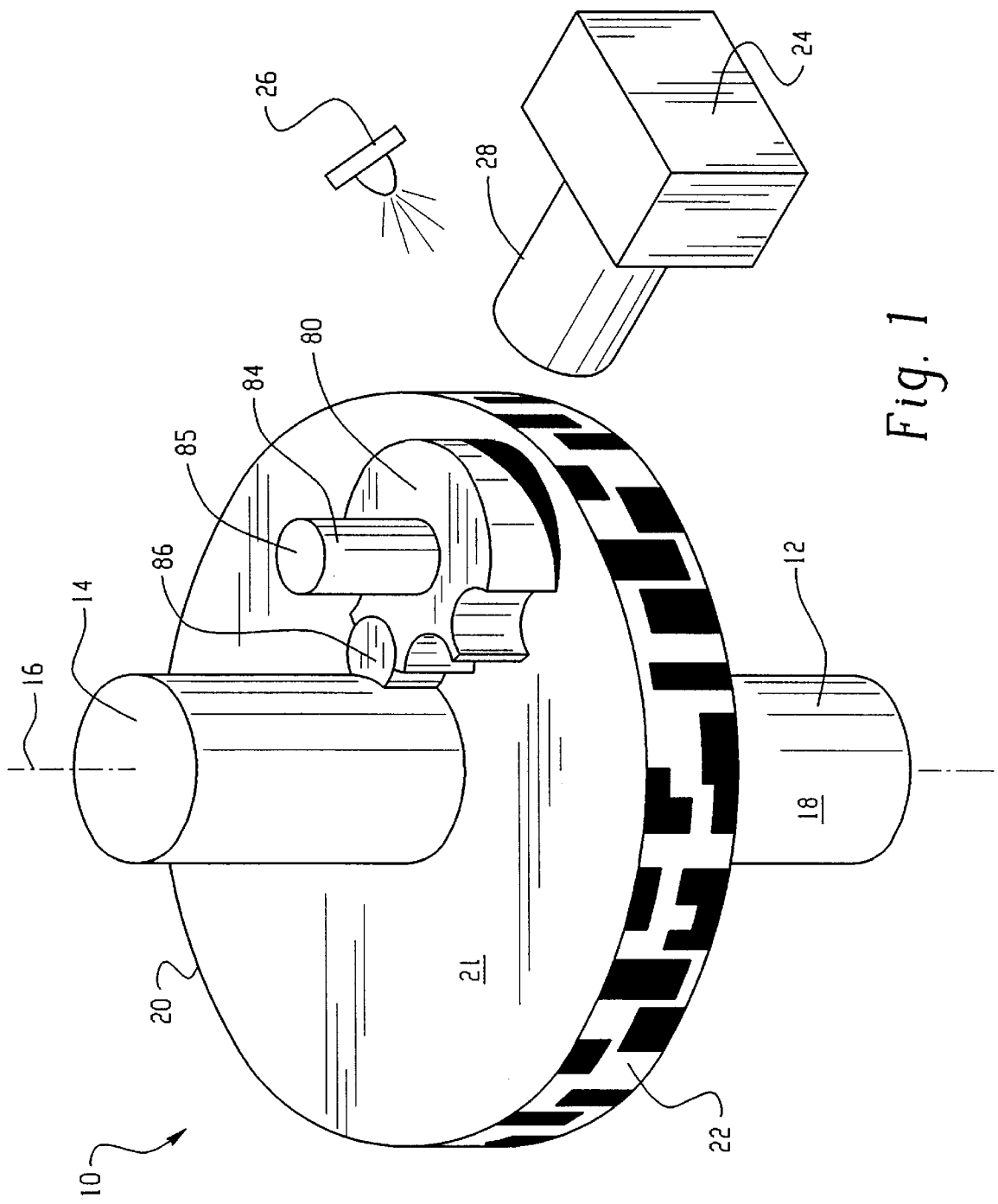
FIG. 1 is a perspective view of a preferred embodiment of the angle sensor of the present invention.

Referring first to FIG. 1, shown is a preferred embodiment of the angle sensor of the present invention in a vehicular steering wheel system 10. System 10 includes a conventional steering column shaft 12 having a top end 14 that is connected in a conventional fashion to a steering wheel (not shown). Shaft 12 rotates around an axis of rotation 16 when the steering wheel is turned by an operator of the vehicle. Shaft 12 has an outer surface 18 around the circumference of which is securely positioned a disc-like code wheel 20. Code wheel 20 can be made of virtually any substantially rigid material, but preferably is made from light weight plastic, such as polycarbonate, that maintains consistent dimensions over broad ranges of temperature and humidity. Although code wheel 20 may be one of many sizes, it is 3 inches (7.6 centimeters) in diameter in a preferred embodiment of the present invention. Code wheel 20 includes an outer circumferential surface 22 on which is positioned a plurality of patterns or code symbols, as described in more detail below. Also shown is a optical device 24 and an illuminating device 26 that are facing and positioned in proximity to surface 22 of code wheel 20. In the preferred embodiment, optical device 24, illuminating device 26, and, at a minimum, surface 22 are all enclosed in a housing (not shown) within the steering column of the vehicle in order to prevent dust and dirt buildup thereon, for reasons described below. Preferably, the housing is made from a light weight plastic material.

Optical device 24 includes an active or passive multi-pixel sensor that operates similar to a miniature video camera. Such an optical device can be purchased from a variety of vendors, and typically has an operation and structure such as that disclosed in U.S. Pat. Nos. 5,625,210 and 5,471,515, the disclosures of which are incorporated herein by reference. Briefly, multi-pixel sensors include a plurality of horizontal and vertical arranged pixels, each of which takes in a portion of the light emanating from a selected target area and generates an electrical signal representative thereof. In this manner, useful information can be obtained regarding the visual appearance of the target. For reasons discussed in more detail below, optical device 24 preferably includes a multi-pixel sensor having at least 57 vertical pixels and 256 horizontal pixels. Although current commercially available multi-pixel sensors may be larger than these preferred dimensions, an algorithm or other method may be implemented in a manner known to one of ordinary skill in the art in order to "window" a larger sensor down to the preferred dimensions.

The difference between an active pixel sensor and a passive pixel sensor is the type of electrical signals that are generated by the pixels. In an active pixel sensor, an analog-to-digital conversion is performed at the pixel level such that digital signals are output from the sensor. In contrast, a passive pixel sensor produces purely analog electrical signals that must be converted via an external analog-to-digital converter if digital signals are needed. Although either can be implemented in the present invention, a passive multi-pixel sensor is presumed for the purposes of explanation.

Optical device 24 faces surface 22 of code wheel 20 so as to "read" the patterns thereon in the manner described above. As code wheel 20 rotates, a different segment of the pattern is viewed by optical device 24. In the preferred embodiment, optical device 24 is positioned 2.5 centimeters away from surface 22. Positioned as such, optical device 24 also includes a lens 28 (preferably wide-angle) in order to focus the light from the patterns onto the pixels of the multi-pixel sensor. It should be recognized that the distance between optical device 24 and surface 22, which dictates the appropriate lens 28 to be used, may be dependent on the amount of space that is available in the vicinity of the steering wheel mechanism in a particular vehicle.

In the preferred embodiment, optical device 24 also includes logic and memory that are used to process the electrical signals generated by the plurality of pixels of the multi-pixel sensor. Alternatively, such logic and memory may be located outside of device 24 in another part of the vehicle. The logic and memory are used to, amongst other things, compare the electrical signals to threshold values whereby quantification of the light entering each pixel is achieved. In this manner, the angular position of code wheel 20, and thus the steering wheel, can be determined, as described below. Although the logic and memory may be hardwired, it preferably is comprised of a microprocessor that executes the required analysis via appropriate programming, as described below in connection with FIG. 7. In alternative embodiments, a DSP (digital signal processor) may be combined with, or used in place of, the microprocessor in order to accommodate higher performance algorithms. Furthermore, optical device 24 preferably implements CMOS technology whereby the logic/memory and the multi-pixel sensor can be combined on a single chip in order to simplify the manufacturing process.

Illuminating device 26 is positioned in any one of a variety of locations in order to illuminate surface 22 of code wheel 20 so that optical device 24 can read the patterns thereon. Illuminating device 26 can be any type of lighting means, including, but not limited to, incandescent lighting, infrared lighting, or LED lighting. In the preferred embodiment, illuminating device 26 comprises two standard LEDs, and is electrically connected in a conventional manner (not shown) to the logic of optical device 24 which controls the functioning thereof, as described below.

Figure 2:
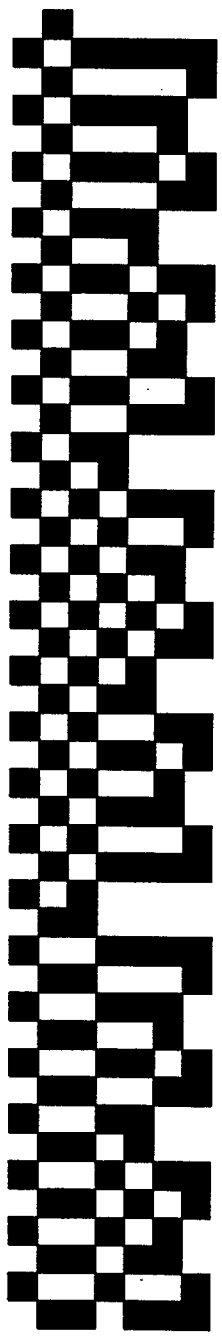
FIG. 2 shows a sample of a pattern comprised of digital black and white binary markings.
Figure 3:
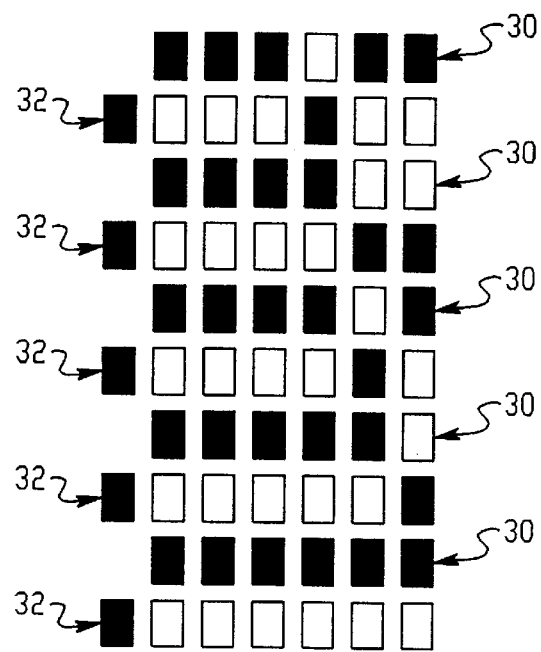
FIG. 3 shows a close-up of a pattern used in a preferred embodiment of the present invention.

The plurality of patterns on surface 22 of code wheel 20 are comprised of any type of markings which are readable by optical device 24. In the preferred embodiment, the patterns are comprised of digital black and white binary markings, a sample of which is shown in FIG. 2. FIG. 3 shows a close-up of a pattern used in the preferred embodiment of the present invention, with the markings boxed and with spacing inserted therebetween solely for the purpose of clarifying the following description. As shown, the patterns are comprised of rows of six black and white marks (reference numeral 30) that alternate with rows of seven white and black marks (reference number 32). In the preferred embodiment, the leftmost marking of "code" rows 32 is always black and is used as a reference mark, for reasons discussed below. The remaining six rightmost markings in pattern rows 32 are able to identify one of 64 unique binary numbers which are used to uniquely identify each rotational position of code wheel 20. As described in more detail below, rows 30 are "checking" rows which function as an error checking mechanism that helps ensure the integrity of information read by optical device 24. In the preferred embodiment described herein, checking rows 30 are in inverse relationship to code rows 32 whereby each of the six markings therein are of the opposite color of the marking thereabove in code row 30.

Recognizing that surface 22 is capable of 360 degrees of positional rotation, each pattern row 32 can thus identify a segment of code wheel 20 covering slightly more than 5.6 degrees (360 divided by 64 equals approximately 5.6). In the preferred embodiment, each mark of rows 30 and 32 is approximately 4 millimeters high and 12 millimeters wide. With these preferred dimensions, pattern rows 30 and 32 completely encompass the outer circumferential surface area 22 of code wheel 20 having a diameter of approximately 3 inches (approximately 76 centimeters).

In the preferred embodiment, the patterns are printed on a polycarbonate sheet having an adhesive backing which enables it to be wrapped around surface area 22. Although polycarbonate material is preferred because of the low amount of glare that is reflected back to optical device 24 and because the material is dimensionally stable over the operating temperature and humidity ranges, it should be recognized that any sheet material can be used, including any plastic such as vinyl. Preferably, such a sheet material is insert molded, and includes an alignment notch for proper positioning thereof on surface 22. Furthermore, it is recognized that many other means of providing such patterns are available and within the scope of the present invention, such as printing or engraving the patterns directly on surface 22 of code wheel 20.

In the preferred embodiment, after the patterns are positioned on surface 22, a sheet of clear plastic or polymer material is laid over the patterns, thus encasing the patterns therebetween. The plastic or polymer material is advantageous in that it prevents the patterns from being scratched off of surface 22, and facilitates the removal of dust and dirt from the patterns (such as with a damp cloth) during maintenance of the angle sensor so that the patterns can be accurately viewed by optical device 24.

As mentioned above, optical device 24 reads the patterns of surface 22. FIGS. 5 and 6 is a window 34 of pattern rows that is viewed by the multi-pixel sensor which, in the preferred illustrated embodiment, includes at least 57 vertical pixels and 256 horizontal pixels, as mentioned above. As shown, window 34 covers enough of surface 22 so as to be capable of viewing at least one "code" row 32 and one "checking" row 30. In the most preferred embodiment, 57 of the at least 57 vertical pixels are used to view each grouping of one code row and one checking row so that a resolution of 0.1 can be achieved, as described below. Through analysis of window 34 via the multi-pixel sensor and associated logic, the angular position of code wheel 20 can be determined, as described below.

Figure 7:
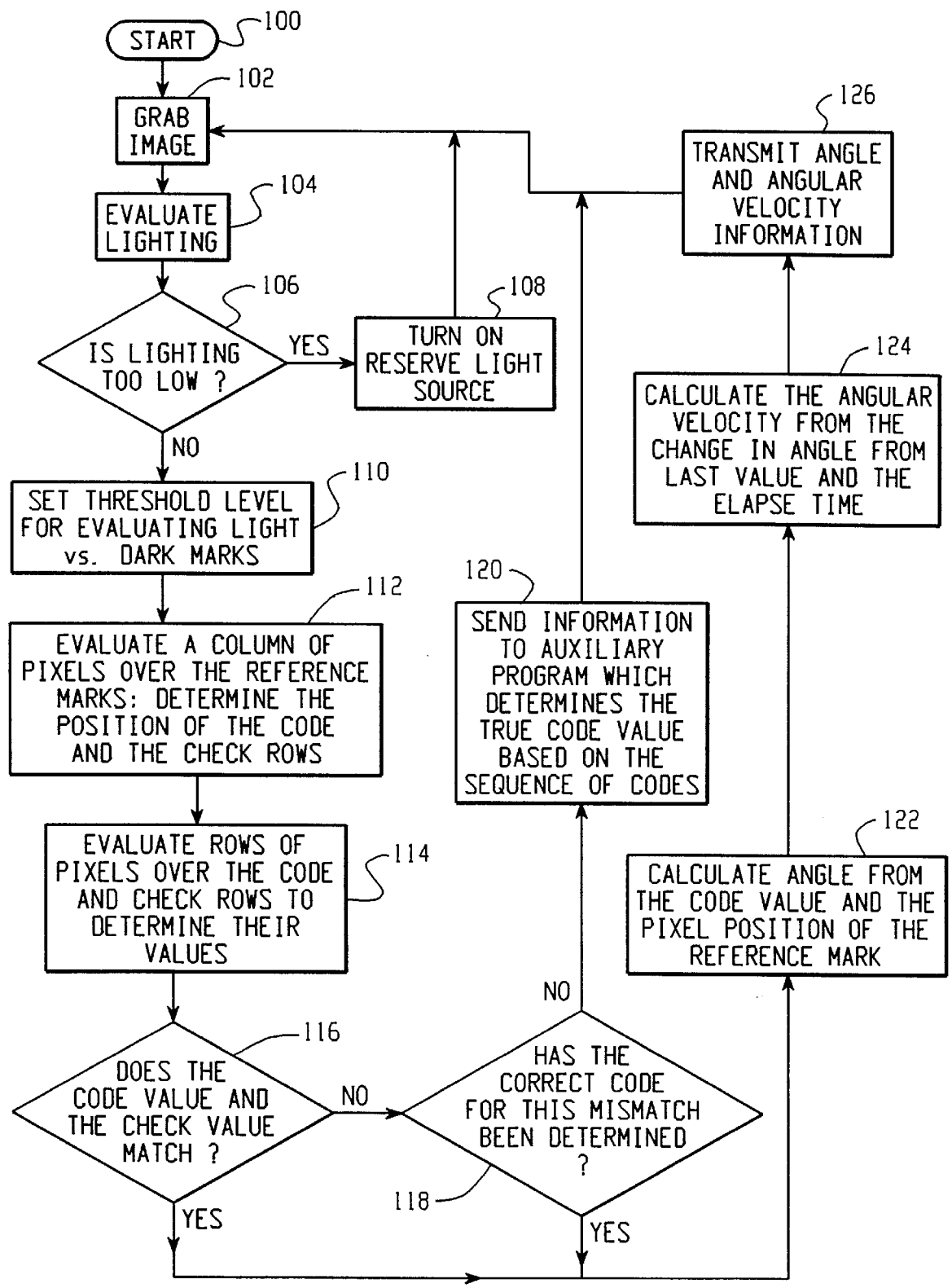
FIG. 7 is the flow diagram for the programming of the microprocessor of a preferred embodiment of the present invention.

Shown in FIG. 7 shows the flow diagram for the programming of the microprocessor in the preferred embodiment of the present invention. This programming controls the analysis by optical device 24 of the patterns on surface 22.

The flow diagram begins with block 100 which signifies the beginning of the program. Next, block 102 causes the multi-pixel sensor to "grab", or read, the image within window 34 from surface 22 of code wheel 20. Block 104 then makes a general analysis of the read image to determine if the sum of electrical signals from all of the pixels falls below a minimum preset threshold value (stored in memory) indicating that surface 22 must not be illuminated sufficiently. Such a situation would indicate that a lighting problem exists with illuminating device 26 which, as mentioned above, consists of two standard LEDs in the preferred embodiment. In this preferred embodiment, only one of the LEDs is operating at any particular time, with the other held in reserve. If block 104 determines that the entire image is black, then block 106 causes the program to proceed to block 108 that causes the reserve (previously unlit) LED to be turned on, and the program loops back to block 102 which is discussed above.

If block 106 determines that the lighting is sufficient, the program proceeds to block 110. Block 110 sets the threshold level (against which the light entering each pixel is compared) for evaluating whether each mark of rows 30 and 32 is black or white. Such a threshold level may vary over time based on the ambient temperature and the age of the LEDs. Block 110 is included only in the embodiment in which a passive multi-pixel sensor is used where there is no automatic analog-to-digital conversion. Next, block 112 analyzes the line of at least 57 vertical pixels located at the horizontal midpoint of the reference mark (leftmost mark) of row 32 in order to determine the transition point between the black of the reference mark (of code row 32) and the white of the checking row 30. This line of pixels (designated with reference numeral 36) is shown in FIGS. 5 and 6 as a solid black line. Block 112 uses this determined transition point to determine the vertical midpoints, and thus position, of both code row 32 and checking row 30. Next, the program proceeds to block 114 in which the horizontal line of 256 pixels extending across the vertical midpoint of code row 32 (designated with reference numeral 38 in FIG. 6) is analyzed to determine the color (black or white) of each of the six markings. This analysis includes the comparison of electrical signals to the threshold value established in block 110. By determining the color of each of the six markings, the pattern, or digital binary "value", of code row 32 is then identified which serves to uniquely identify a rotational position of code wheel 20. Block 114 also analyzes the horizontal line of 256 pixels extending across the vertical midpoint of checking row 30 (designated with reference numeral 40 in FIG. 6) in order to determine the color of each of the six markings and thus the digital "value" of the row. As mentioned above, checking row 30 is for error checking purposes, with markings that are in inverse relationship to the corresponding markings in code row 32. This inverse relationship is taken into account when calculating the value of checking row 30 such that the value thereof is the same value of code row 32 in the normal situation where no error exists.

Next, block 116 determines if the value of code row 32 matches the value of checking row 30. If so, then a "good" (non-error) reading is presumed, and the program proceeds to block 122 which is described below. If not, indicating that an error exists that is probably due to dust or dirt buildup on surface 22, the program proceeds to block 118 which determines if the correct code value for this particular mismatch has been already determined via block 120 during previous execution cycles of the program. If not, the program proceeds to block 120 which determines the correct value of code row 32 based on the memorized sequence of code row values that have been read as code wheel 20 has rotated. By looking at the code row values that have been calculated for rotational positions both before and after the rotational position corresponding to the mismatch, the sequence thereof indicates which of the mismatched code row value and the checking row value should be correct. Once the correct value is determined, it is saved in memory to be retrieved if the same mismatch appears later in the execution of the program, and the program loops back to block 102 which is discussed above.

If block 118 determines that the correct code value for the particular mismatch has already been determined, then the correct code value is read from the memory of the microprocessor, and the program proceeds to block 122. Block 122 calculates and stores the precise angle of rotation of code wheel 20, and thus the angle of rotation of the steering wheel, based on the value of the code row and the position of the transition point of the reference mark. As mentioned above, each of the code row values uniquely identifies a section of code wheel 20 covering approximately 5.6 degrees, with the memory of the microprocessor storing the angular displacement of code wheel 20 corresponding to each code row value. The position of the transition point of the reference mark enables the angle sensor of the present invention to realize increased resolution within this 5.6 degree framework. By determining the location of the transition point within the 57 vertical pixels that are used to view each code row/checking row grouping in window 34 of the described preferred embodiment, each 5.6 degree section can be further divided by 57, thus enabling a resolution of 0.1 to be achieved when calculating the angle of rotation of code wheel 20.

After block 122, block 124 calculates the angular velocity of code wheel 20 based on the change between the current angle of rotation and the previous (stored) angle of rotation in view of the elapsed time therebetween. This calculation of angular velocity is included in the preferred embodiment of the present invention since it provides additional useful information that can be used in the vehicle. However, the calculation of angular velocity is not needed for the basic operation of the angle sensor.

After block 124, the program proceeds to block 126 which causes the angle and angular velocity information to be transmitted to appropriate devices that can make use of such information. In a vehicle, such devices include the power steering control and the suspension control systems. After block 126, the program loops back to block 102 which is discussed above.

Although the patterns and markings shown in FIG. 2 are preferred, it should be recognized that many variations are possible and within the scope of the present invention. For example, any type of digital markings may be used in place of binary (for example, ternary), and any distinguishable colors or shades may be used. However, such modifications to the markings would require more complex logic functions for analysis (since more threshold values would be required), and may make it harder to detect images that have been corrupted due to dust or dirt buildup on surface 22. In addition, depending on the size and diameter of code wheel 22, the rows of patterns can be vertically spaced apart by varying distances. Furthermore, the markings themselves can be of virtually any shape instead of square, and can be variably sized as well depending on lens 28 and the size of optical device 24. However, an important consideration with respect to the size of the markings is to choose a size that is large enough such that most particles of dust or dirt would be smaller than the markings, thereby preventing small quantities of particles of dust or dirt from affecting the reading of the markings by optical device 24.

In many applications for the angle sensor of the present invention, the rotational body may be capable of more than one complete revolution. For example, many vehicular steering systems enable the steering wheel to be turned two complete revolutions in either direction, meaning that the determined angular position could be in any one of four revolutions of code wheel 20. In these situations, it often is desirable to enable the angle sensor to determine which revolution the rotating body is in (its "revolution count") so as to add meaning to the angular position thereof.

Figure 8:
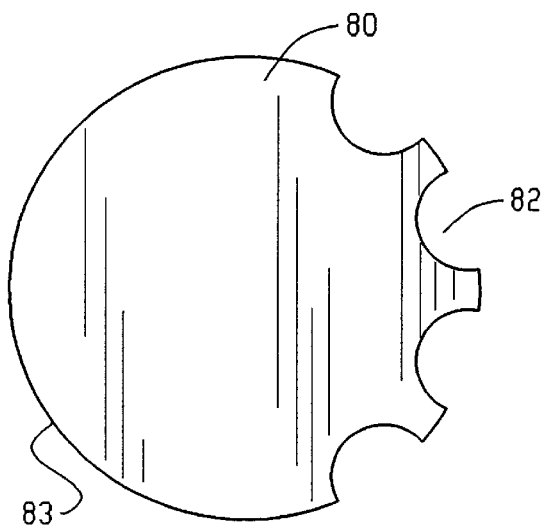
FIG. 8 is a plan view of an indexing wheel used in a preferred embodiment of the present invention.
Figure 9:
FIG. 9 shows a close-up of a pattern used in a preferred embodiment of the present invention.

FIG. 1 shows a revolution counter of the present invention comprising an indexing wheel 80 which includes a plurality of recesses 82 (FIG. 8). Indexing wheel 80 is not in physical contact with the upper surface of code wheel 20, but instead is connected to, and rotates with, a separate rotatable shaft 84 having an upper surface 85 that is rotatably attached to any secure structure within the steering mechanism assembly. On the outer surface area 83 of indexing wheel 80, opposite that of recesses 82, is positioned a pattern that is readable by optical device 24, as described in more detail below. In the preferred embodiment, the pattern includes a black, triangular shaped portion surrounded by white, a close-up view of which is shown in FIG. 9. Also shown is a tooth or projection 86 that rotates with code wheel 20 and shaft 14. Projection 86, for ease of manufacture and installation, preferably is an integral part of code wheel 20. Indexing wheel 80 and projection 86 are in operative relationship with one another whereby the complete rotation of projection 86 in either direction (corresponding to one complete revolution of code wheel 20) causes the engagement of projection 86 with one of recesses 82 of indexing wheel 80. This engagement causes indexing wheel 80 to be incremented (rotated in step fashion) in a direction of rotation that is opposite that of projection 86. In a preferred embodiment in which indexing wheel 80 includes four recesses 82 (as shown in FIG. 8), the four revolution range of motion of the steering wheel corresponds to five segments of the triangular pattern on indexing wheel 80, with the four recesses providing for the movement between these five segments. The range of motion is divided into five segments on indexing wheel 80 so that projection 86 is not in contact with indexing wheel 80 when the vehicle is travelling straight ahead.

In this preferred embodiment including the revolution counter, the window 34 of optical device 24 is horizontally extended (preferably by adding additional horizontal pixels in order to retain the same resolution) so that the patterns on both code wheel 20 and indexing wheel 80 are viewed. Each incrementation of indexing wheel 80 then causes a different section of the triangular pattern thereon to be viewed by optical device 24.

The position of indexing wheel 80 can be processed via the programming of the microprocessor. Similar to the reading of rows 30 and 32 discussed above, a horizontal line of pixels such as line 38 or 40 (FIG. 6) is selected, and the portion corresponding to the view of indexing wheel 80 is analyzed. Based on the readings of these pixels (light or dark), the width of the section of the black triangular pattern that is in the field of view of optical device 24 is determined.

The calculated width is then compared to values stored in the memory of the microprocessor which encompass the range of widths that are viewable by optical device 24 for each revolution count. In this manner, the actual revolution count of code wheel 20 can be determined. The revolution count can then be transmitted to an appropriate device to supplement the calculated angular position information, thereby providing the position of the steering wheel in its complete range of motion.

The mechanical design of the revolution counter discussed above is preferred because operation thereof is not dependent upon continued electrical power-up of the vehicle. As such, the proper revolution count information will be immediately available to optical device 24 at all times.

Furthermore, the design of the revolution counter discussed above is advantageous in that physical contact between indexing wheel 80 and projection 86 is limited to only once every revolution of code wheel 20. As such, the longevity of the mechanism is increased, and less loose particles are produced (via rubbing) that could contaminate the patterns used in the present invention. However, during the time that indexing wheel 80 is not engaged by projection 86, indexing wheel 80 may be subject to external forces, such as vibration, that can cause unwanted movement thereof. Therefore, in a preferred embodiment of the present invention, one variety of a Geneva mechanism is implemented in a fashion known to one of ordinary skill in the art in order to prevent unwanted movement of indexing wheel 80.

Figure 10:
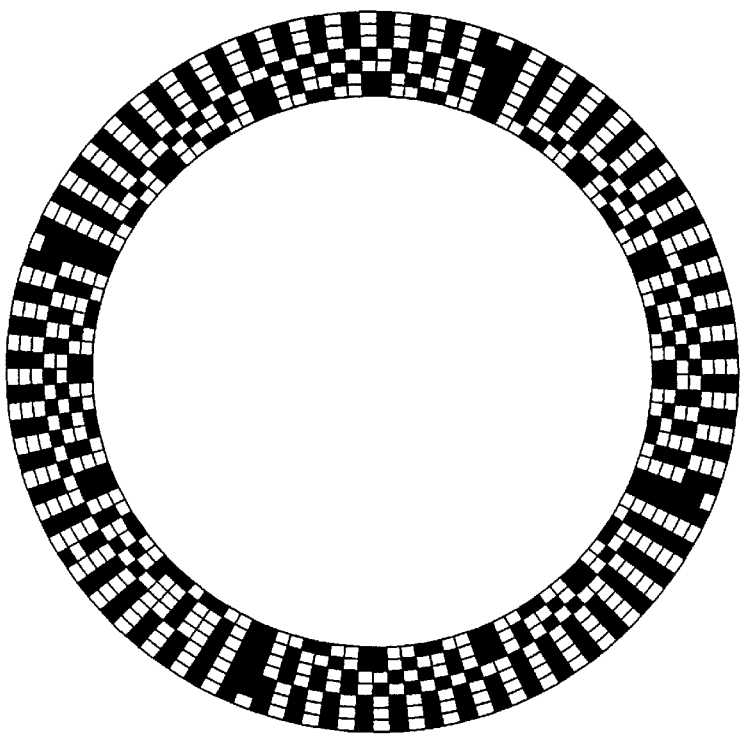
FIG. 10 shows a sample of a pattern used in an alternative embodiment of the present invention.

In alternative embodiments of the present invention, the patterns positioned on surface 22 of code wheel 20 in FIG. 1 can be positioned on any surface that enables the patterns to rotate as the rotating body rotates, with minor modifications to the set-up of the rest of the angle sensor. For example, the patterns can instead be positioned on a surface that is perpendicular to the axis of rotation of the rotating body. As such, with respect to FIG. 1, the patterns could be positioned on upper surface 21 of code wheel 20 (assuming that the revolution counter was not used, or was positioned elsewhere). In such an embodiment, the patterns could be circular in shape, with a geometric center at the axis of rotation 16 of shaft 12. A sample of such a polar or circular pattern is shown in FIG. 10. Preferably, such a pattern would include the digital black and white markings discussed above and shown in FIGS. 2 and 3 in connection with the preferred embodiment, although any one of a variety of patterns could of course be used. Optical device 24 and illuminating device 26 in this alternative embodiment would be positioned differently than that shown in FIG. 1 to enable them to appropriately interact with the differently positioned pattern. Otherwise, the structure and operation of this embodiment would be the same as discussed above.

The decision as to the placement of the patterns (and the corresponding positioning off optical device 24 and illuminating device 26) is dependent on the amount and configuration of the space in the vicinity of the rotating body.

Figure 11:
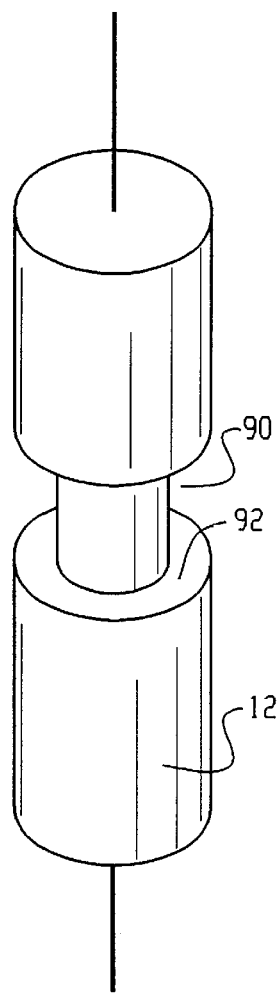
FIG. 11 is a perspective view of a rotating shaft of an alternative embodiment of the present invention on which a circular pattern may be implemented.

As discussed above, the preferred embodiment of the present invention includes a disc-like code wheel 20 (having patterns thereon) which is positioned on surface 18 of shaft 12 (FIG. 1). Such a code wheel is preferred since, by modifying the inner diameter thereof, it enables the present invention to easily be installed on rotating bodies of various outer diameters. However, it should be recognized that the present invention can be implemented without such a code wheel. In these alternative embodiments, the patterns would instead be positioned directly on the rotating body itself in any manner, such as those described above for placing the patterns on surface 22. In FIG. 1, this would involve the placement of the patterns on surface 18 along the circumference of shaft 12. Alternatively, as shown in FIG. 11, shaft 12 could include a cut-out section 90 that creates a surface 92 that is perpendicular to the axis of rotation and on which the circular or polar pattern could be positioned. The pattern could then be read by optical device 24, as discussed above.

In addition to, or in place of, the checking row 30 of the preferred embodiment discussed above, alternative embodiments of the present invention can implement error checking by the inclusion of a parity bit to code row 32 (to make the number of markings even or odd), as is known to one of ordinary skill in the art.

In an alternative embodiment of the present invention, illuminating device 26 can be positioned to shine light through a pattern as opposed to reflecting light of the pattern (as is shown in FIG. 1). Although there are many such ways of structuring such an alternative embodiment, one way would consist of a code wheel 20 having transparent material for surface 22, with an illuminating device positioned behind surface 22 (within wheel 20) and shining light through an opaque pattern and towards optical device 24.

In applications where the angle sensor of the present invention is not in an enclosed environment, it is recognized that the angle sensor could function without an illuminating device, instead relying on ambient light.

Figure 4:
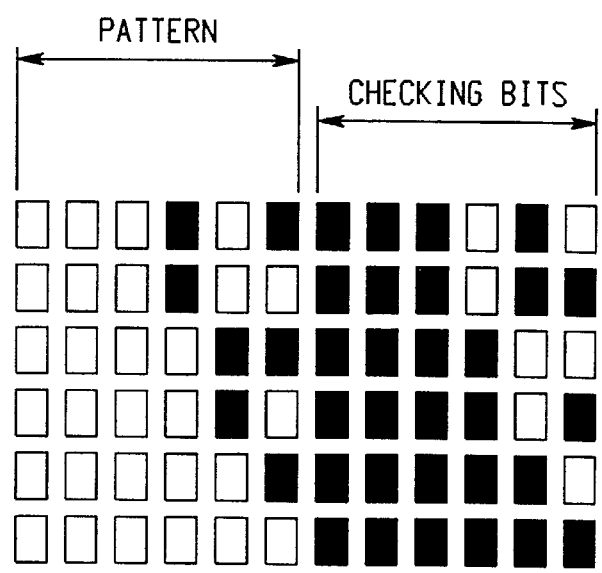
FIG. 4 shows a close-up of a pattern used in an alternate embodiment of the present invention.

As an alternative to the code row/checking row pattern shown in FIG. 3, the checking row can be on the same row as (and next to) the code row, as shown in FIG. 4, or the markings for each can be intermingled (alternating) on the same row.

Although several patterns have been set forth as patterns that will function in the angle sensor of the present invention, it should be realized that multi-pixel sensors can work with and analyze virtually any type of pattern, simple or complex. As such, many diverse variations in pattern type can be implemented and are within the scope of the present invention.

The above description is considered that of the preferred embodiments only. Modifications of the invention may occur to those skilled in the art and to those who make or use the invention. Therefore, it is to be understood that the embodiments shown in the drawings and described above are merely for illustrative purposes and are not intended to limit the scope of the invention, which is defined by the following claims as interpreted according to the principles of patent law, including the doctrine of equivalents.

We claim:

1. A method for determining the angular position of a rotating body, the method comprising the steps of:
    positioning a plurality of patterns on a selected area of the rotating body whereby each of said patterns passes a fixed reference area as the rotating body rotates, said plurality of patterns comprising a set of first patterns and a set of second patterns, with each of said second patterns corresponding to and in inverse relationship to one of said first patterns;
    illuminating a section of said selected area as it passes said fixed reference area as the rotating body rotates;
    implementing a multi-pixel optical device positioned at said fixed reference area to convert at least a portion of said illuminated section into a plurality of electrical signals; and
    processing said electrical signals to identify said patterns as said patterns pass said fixed reference area, including comparing the electrical signals from each of said first patterns to the electrical signals from its corresponding second pattern to determine if an error exists.

2. An angle sensor for determining the angular position of a rotating body, comprising:
    a plurality of digital patterns positioned on a surface that rotates with said rotating body;
    a source of light for illuminating a section of said digital patterns at a fixed reference area;
    a multi-pixel optical device positioned at said fixed reference area, said optical device receiving light from said section of said digital patterns and converting the light into a plurality of electrical signals; and
    a processing circuit connected to said multi-pixel optical device and receiving said electrical signals, said processing circuit including logic and memory for analyzing said electrical signals and identifying said digital patterns at said fixed reference area.

3. The angle sensor of claim 2 wherein said digital patterns are black and white binary markings arranged in rows and representing unique binary numbers.

4. The angle sensor of claim 2 wherein said plurality of digital patterns is positioned on an outer surface of the rotating body.

5. The angle sensor of claim 2 further comprising a disc-like code wheel positioned on the rotating body and rotating therewith, and wherein said plurality of digital patterns is positioned on an outer surface of said code wheel.

6. The angle sensor of claim 5 wherein said plurality of patterns is positioned on the outer circumferential surface of said code wheel.

7. The angle sensor of claim 5 wherein said plurality of patterns is circular in shape and is positioned on a surface of said code wheel that is perpendicular to the axis of rotation of the rotating body.

8. The angle sensor of claim 6 further including a revolution counter, said revolution counter comprising:
    a projection that rotates with the rotating body;
    a rotatable shaft; and
    an indexing wheel connected to said rotatable shaft and having a pattern positioned on a first portion of the circumferential surface of said indexing wheel in physical proximity to said fixed reference area, said indexing wheel having a plurality of recesses positioned within a second portion of the circumferential surface of said indexing wheel, said recesses and said projection in operative relationship such that one of said recesses is engaged by said projection upon each complete revolution of said rotating body, said engagement rotating said indexing wheel in step fashion; and
    wherein said source of light illuminates a section of said indexing wheel pattern at said fixed reference area, said multi-pixel optical device receiving light from said section of said indexing wheel pattern and converting the light into electrical signals, and said processing circuit analyzing said electrical signals and identifying the stepped position of said indexing wheel.

9. The angle sensor of claim 8 wherein said indexing wheel pattern comprises a triangular shape positioned such that the width of said section of said indexing wheel pattern illuminated by said source of light is different for each stepped rotation of said indexing wheel.

10. The angle sensor of claim 3 wherein said multi-pixel optical device includes a two dimensional grid of pixels, and wherein said processing circuit analyzes the electrical signals from a line of vertical pixels within said grid and identifies the transition point between said rows.

11. The angle sensor of claim 7 wherein said processing circuit uses said transition point to determine the vertical midpoint of a row, said processing circuit analyzes the line of horizontal pixels at said vertical midpoint to calculate the binary value of said row, and said processing circuit uses the binary value and said transition point to determine the precise angle of rotation of the rotating body.

12. The angle sensor of claim 2 wherein said plurality of digital patterns comprises a set of first patterns and a set of second patterns, each of said second patterns corresponding to and in inverse relationship to one of said first patterns, and wherein said processing circuit compares the electrical signals from each of said first patterns to the electrical signals from its corresponding second pattern to determine if an error exists.

13. The angle sensor of claim 3 wherein each of said rows of binary markings includes a parity marking, and wherein said processing circuit uses said parity marking to determine if an error exists.

14. The angle sensor of claim 2 wherein said source of light is positioned such that said optical device receives light that is reflected off of said section of said digital patterns.

15. The angle sensor of claim 6 wherein said outer circumferential surface of said code wheel is comprised of transparent material, portions of said plurality of digital patterns is comprised of opaque material, and said source of light is positioned within said code wheel such that said optical device receives light that travels through said section of said digital patterns.

16. The angle sensor of claim 2 wherein said source of light comprises an incandescent lighting device.

17. The angle sensor of claim 2 wherein said source of light comprises an infared lighting device.

18. The angle sensor of claim 2 wherein said source of light comprises an LED.

19. The angle sensor of claim 2 wherein said source of light is ambient light.

20. The angle sensor of claim 2 wherein said multi-pixel optical device includes a lens to focus the light received from said section of said digital patterns.

* * * * *